United States Patent [19]

Ueno et al.

[11] Patent Number: 5,132,643
[45] Date of Patent: Jul. 21, 1992

[54] CRYSTAL RESONATOR WITH PLURAL ELECTRODES FOR USE IN A CRYSTAL OSCILLATING DEVICE OF A TEMPERATURE COMPENSATION TYPE

[75] Inventors: Yoshifusa Ueno, Tokorozawa; Hiroaki Ishii, Sayama; Hiroshi Shimizu, Sendai, all of Japan

[73] Assignee: Nihon Dempa Kogyo Co., Ltd., Tokyo, Japan

[21] Appl. No.: 660,431

[22] Filed: Feb. 22, 1991

[30] Foreign Application Priority Data

Feb. 28, 1990 [JP] Japan .................................. 2-50453

[51] Int. Cl.⁵ ............................................. H03B 5/32
[52] U.S. Cl. ..................................... 331/163; 331/176; 310/366
[58] Field of Search ............. 331/163, 116 R, 116 FE, 331/158, 176; 310/366

[56] References Cited

U.S. PATENT DOCUMENTS 4,329,666 5/1982 Arvanitis ....................... 310/366 X

OTHER PUBLICATIONS

Bellucci et al, "A New Type of AT-Cut Quartz Resonator with Q-Factor and Frequency of the Unwanted Modes Controlled," IEE Transactions on Sonics and Ultrasonics vol. SU-28, No. 6, Nov. 1981, pp. 460–467.

*Primary Examiner*—Siegfried H. Grimm
*Attorney, Agent, or Firm*—Frishauf, Holtz, Goodman & Woodward

[57] ABSTRACT

A crystal resonator with plural electrodes comprises a crystal piece, first, second and third pairs of electrodes. The crystal piece causes shear vibration. The first electrode pair is provided in the center of the crystal piece and coupled to a variable impedance. The second and third electrode pairs are provided on both sides of the first electrode pair. The second and third electrode pairs are electrically connected together and are coupled to an oscillation circuit.

6 Claims, 6 Drawing Sheets

FRONT SURFACE    REAR SURFACE

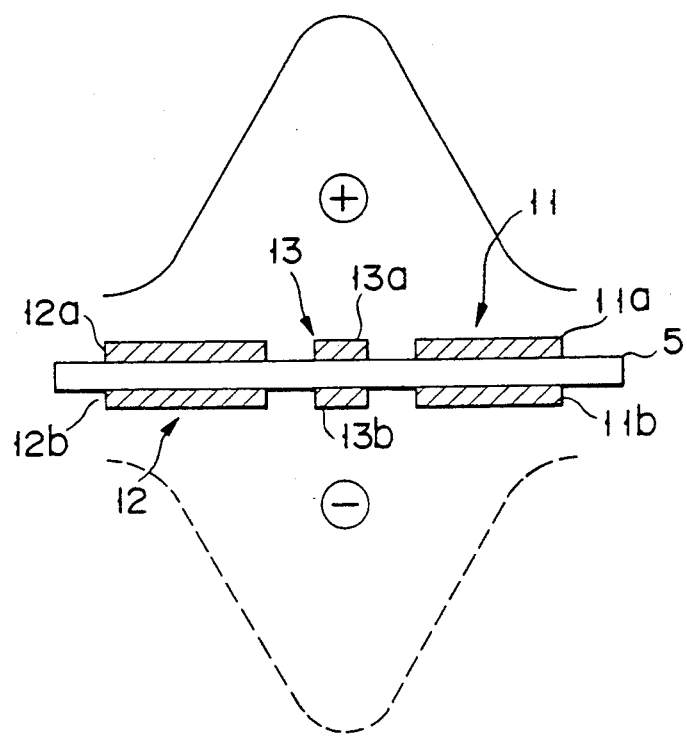
F I G. 6
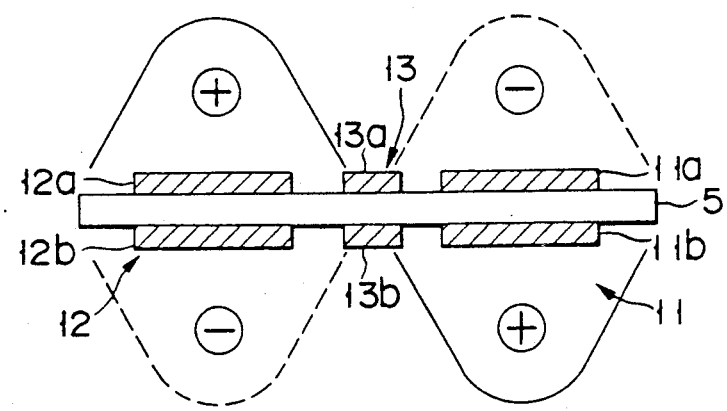
F I G. 7

CRYSTAL RESONATOR WITH PLURAL ELECTRODES FOR USE IN A CRYSTAL OSCILLATING DEVICE OF A TEMPERATURE COMPENSATION TYPE

BACKGROUND OF THE INVENTION

1. Field of the Invention

The present invention relates to a crystal resonator with plural electrodes for use in a crystal oscillating device. More particularly, the present invention pertains to a crystal resonator with plural electrodes for use in a crystal oscillating device of a temperature compensation type.

2. Description of the Related Art

A crystal oscillating device using a crystal resonator with plural electrodes has been developed by the present inventors, and is used specifically as a crystal oscillating device of a temperature compensation type. This crystal oscillating device is disclosed in, for example, U.S. patent application Ser. No. 07/382,107 (now U.S. Pat. No. 5,004,988).

FIG. 1 exemplifies this type of a crystal oscillating device. The crystal oscillating device comprises a crystal resonator 1 with plural electrodes, an oscillation circuit 2, a temperature compensation circuit 3, and a frequency adjusting element 4. The crystal resonator 1 includes a crystal piece 5 of, for example, an AT-cut type, which activates thickness shear vibration. Two pairs of electrodes, 6a and 6b, and 7a and 7b, are provided facing each other on both surfaces of the crystal piece 5 in the direction of the z' axis. The oscillation circuit 2 and the frequency adjusting element 4 are arranged in series between the electrode pair 6a and 6b. The temperature compensation circuit 3 is connected between the other electrode pair 7a and 7b. The oscillation circuit 2 oscillates a resonator by the electrodes 6a and 6b at a frequency which depends on temperature. The frequency adjusting element 4 is a variable capacitor which adjusts the oscillation frequency to a predetermined value. In the temperature compensation circuit 3, a compensation voltage oscillating circuit 8 generates a compensation voltage corresponding to the ambient temperature to change the capacitance of a voltage-variable capacitor 9.

In the crystal oscillating device with this structure, the change in the capacity of the voltage-variable capacitor 9 varies additional capacitance of the oscillation circuit 2 due to the elastic coupling of the two electrode pairs 6a and 6b, and 7a and 7b, thus compensating the frequency-temperature characteristic. Moreover, since the frequency adjusting element 4 is not electrically coupled to the temperature compensating circuit 3, the influence on the temperature compensation circuit 3 at the time of adjusting the frequency is reduced, thus enhancing the reliability.

Because the crystal resonator with the above structure uses the resonator 1 with plural electrodes, however, non-harmonic high-order vibration in an antisymmetric mode $f_{a1}$ occurs near the main oscillation frequency $f_0$ with respect to the main vibration (symmetric mode $f_{s1}$) as shown in FIG. 2. A resonance characteristic shown in FIG. 7 is the result of the measurement conducted by a transmission characteristic method. This phenomenon will be explained as follows. The thickness shear vibration has countless modes represented by a mode symbol (y, x, z) where "y" is the order of an overtone in the direction of thickness, and "x" and "z" are the orders of the peak and valley of vibration in each direction. When the electrode pairs 6a and 6b, and 7a and 7b are arranged along the z' axis, two modes are generated: a symmetric mode $f_s$ in which "z" in the mode symbol is an odd number, and an antisymmetric mode $f_a$ in which "z" is an even number. Particularly, the symmetric mode $f_{s1}$ (main vibration) with the mode symbol (y, 1, 1) as shown in FIG. 3A, and the antisymmetric mode $f_{a1}$ (y, 1, 2), closest to the symmetric mode $f_{s1}$, as shown in FIG. 3B are forcible generated. When there is only one pair of electrodes 10a and 10b as shown in FIG. 3C, the antisymmetric mode will not be generated because displacement-originated charges will cancel out each other.

Accordingly, the use of the above-structured crystal resonator causes a frequency pump that the oscillation frequency moves from the main vibration frequency $f_0$ to the vibration frequency in antisymmetric mode $f_{a1}$.

SUMMARY OF THE INVENTION

It is therefore an object of the present invention to provide a resonator with plural electrodes which suppresses the occurrence of the antisymmetric mode to prevent the frequency jump phenomenon.

To achieve this object, according to one aspect of the present invention, there is provided a crystal resonator with plural electrodes which comprises:

a crystal piece for causing thickness shear vibration;

a first pair of electrodes provided in a center of the crystal piece and coupled to a variable impedance; and second and third pairs of electrodes provided on both sides of said first pair of electrodes, electrically connected together, and adapted to couple to an oscillation circuit.

According to another aspect of the present invention, there is provided a crystal resonator with plural electrodes which comprises:

a crystal piece for causing thickness shear vibration;

a first pair of electrodes provided in a center of the crystal piece and coupled to an oscillation circuit; and second and third pairs of electrodes provided on both sides of said first pair of electrodes, electrically connected together, and coupled to a variable impedance.

Additional objects and advantages of the present invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 6 and 7 are diagrams for explaining the operation of the resonator of the first embodiment according to the present invention;

DETAILED DESCRIPTION OF THE PREFERRED EMBODIMENTS

Figure 1:
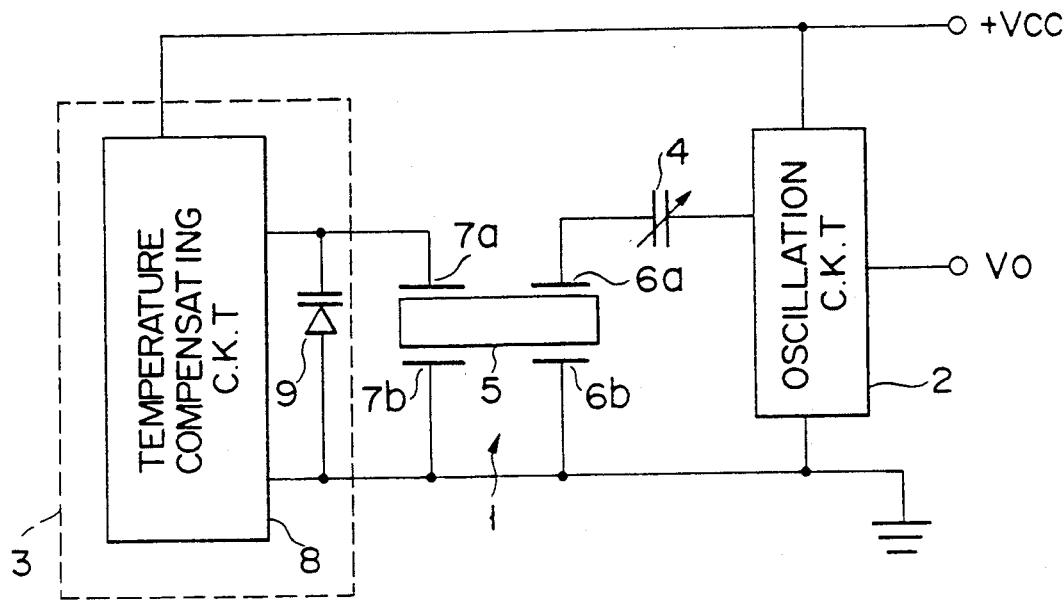
FIG. 1 is a block diagram illustrating a temperature compensation oscillating device using a conventional resonator with plural electrodes.
Figure 2:
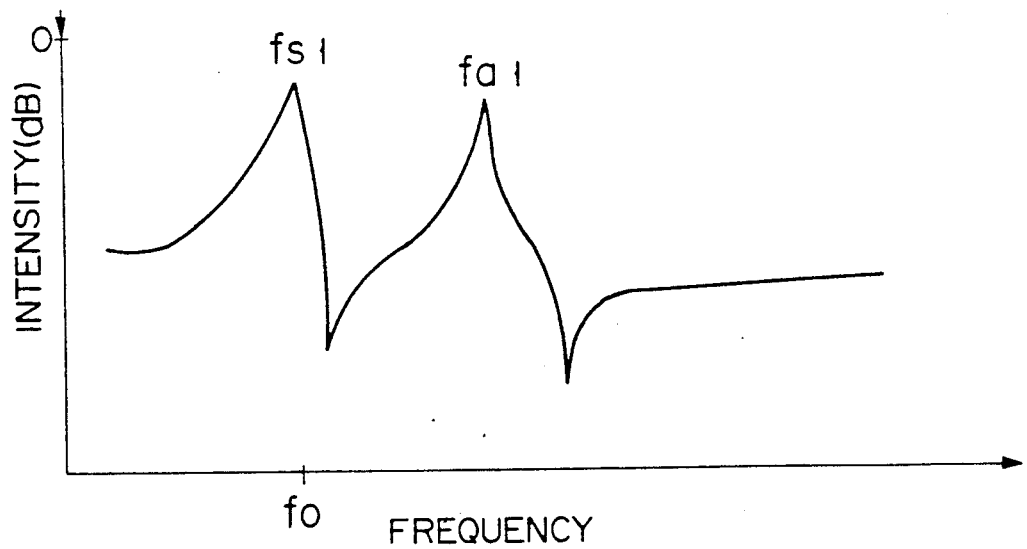
FIG. 2 is a diagram illustrating a resonance characteristic of the resonator shown in FIG. 1.
Figure 3A:
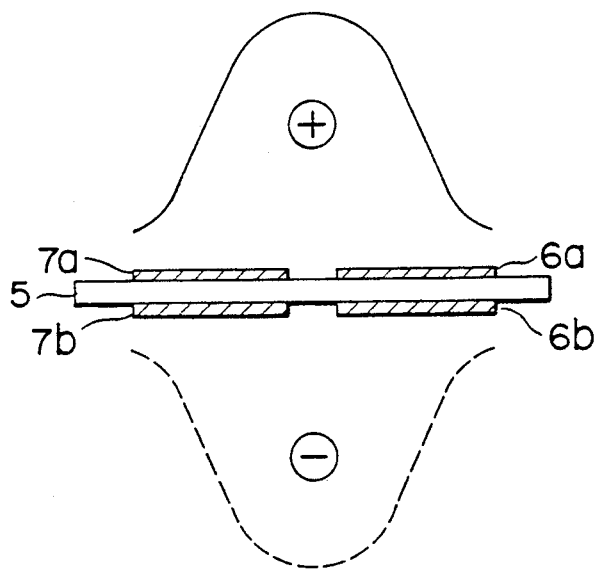
FIGS. 3A through 3C are diagrams illustrating the displacement distribution of the conventional resonator with plural electrodes.
Figure 3B:
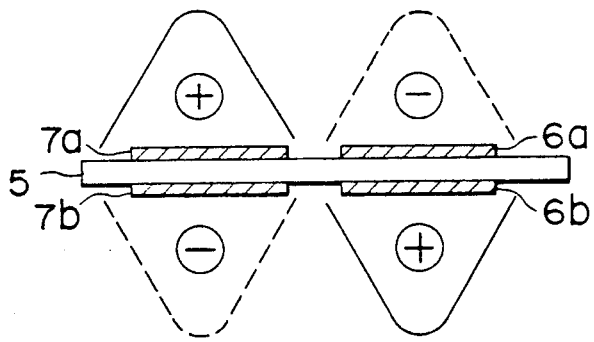
Figure 3C:
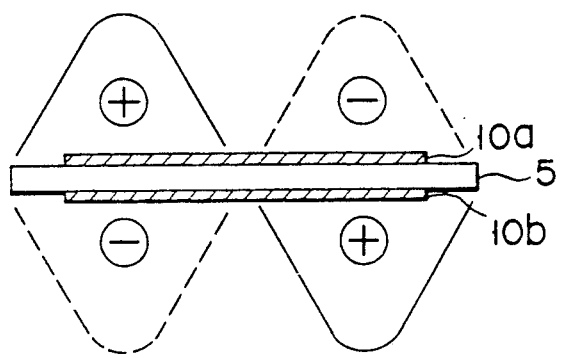
Figures 4A, 4B:
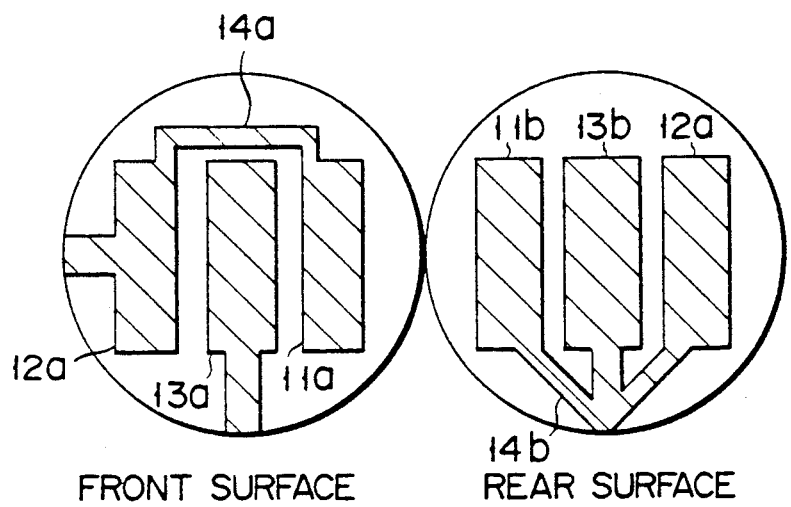
FIGS. 4A and 4B are development diagrams illustrating the electrode arrangement in front and rear surfaces of a resonator with plural electrodes according to the first embodiment of the present invention.
Figure 5:
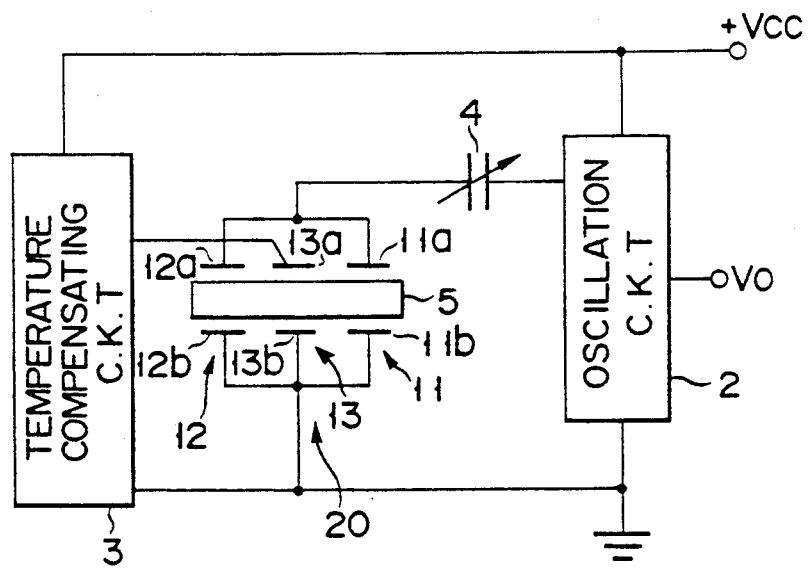
FIG. 5 is a block diagram of a temperature compensation oscillating device using the resonator with plural electrodes of the first embodiment.

An resonator with plural electrodes according to one preferred embodiment of the present invention will now be described referring to FIGS. 4A to 8. For the components of this embodiment corresponding or identical to those in FIG. 1, like reference numerals are used to omit their otherwise redundant description.

A resonator 20 with plural electrodes comprises an AT-cut disk crystal piece 5, and three pairs of electrodes 11, 12, and 13, provided on both surfaces of the crystal piece 5. The electrode pair 11 includes electrodes 11a and 11b, and the electrode pair 12 electrodes 12a and 12b. The last electrode pair 13 includes electrodes 13a and 13b. The electrodes in each electrode pair, 11a and 11b, 12a and 12b, or 13a and 13b, are formed facing each other in the direction of the z' axis. In this embodiment, the electrodes 11a and 12a at a front main surface of crystal piece 5 are electrically connected together by a path 14a (see FIG. 4a) and the electrodes 11b, 12b and 13b at a rear main surface of piece 5 by a path 14b (see FIG. 4B). The electrode pairs 11 and 12 act as exciting electrode pairs. The center electrode pair 13 serves as compensation electrodes.

The exciting electrode pairs 11 and 12 are connected to the oscillation circuit 2 through the frequency adjusting element 4 comprising a voltage-variable capacitor, for example. The compensation electrode pair 13 is connected to the temperature compensation circuit 3.

According to the crystal resonator of this type, the symmetric mode $f_{s1}$ of (y, 1, 1) forces the electrodes 11a and 12a, and the electrodes 11b and 12b to respectively generate charges of the same sign, and the electrodes 11a and 12b, and 11b and 12b are connected together by the respective paths 14a and 14b. Therefore, the symmetric mode (y, 1, 1) is excited as the main vibration as per the prior art.

Since the antisymmetric mode $f_{a1}$ of (y, 1, 2) forces the electrodes 11a and 12a, and the electrodes 11b and 12b to generate charges of different signs, as shown in FIG. 7, and the electrodes 11a and 12a, and 11b and 12b are connected together by the respective paths 14a and 14b, the charges are canceled out so as to restrain the antisymmetric mode $f_{a1}$ of (y, 1, 2).

Figure 8:
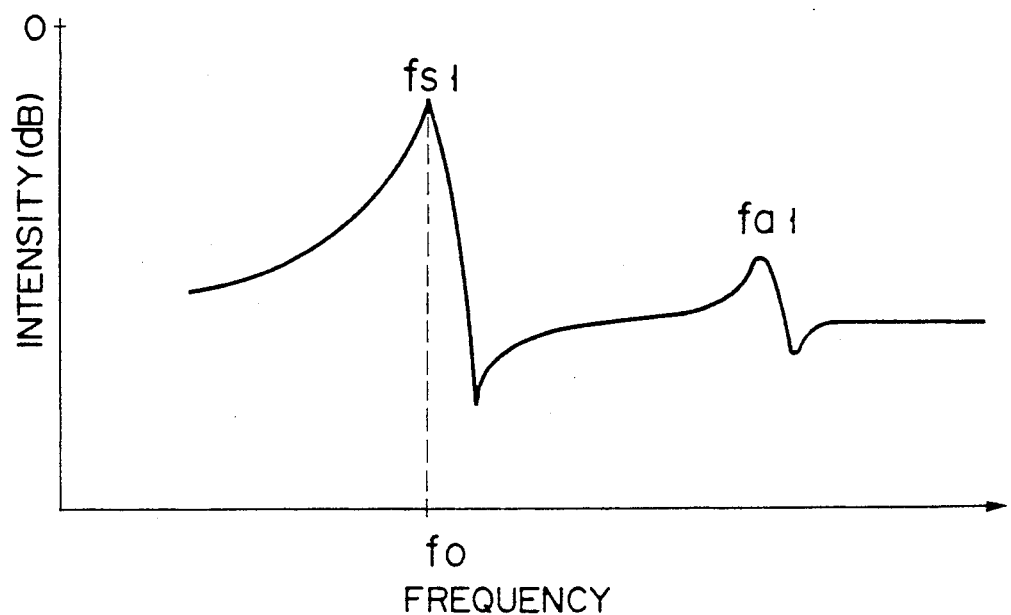
FIG. 8 is a diagram illustrating a resonance characteristic of the resonator of the first embodiment.

As the vibration level of the antisymmetric mode $f_{a1}$ is relatively small as shown in FIG. 8, the frequency jump phenomenon from the main vibration frequency $f_0$ to the vibration frequency $f_a$ in the antisymmetric mode will be prevented.

Figure 9:
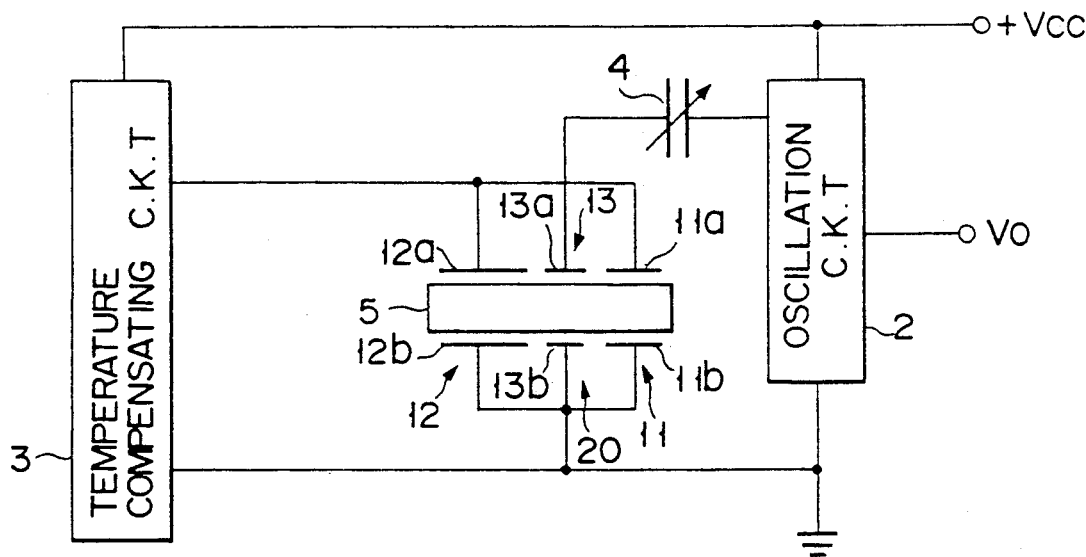
FIG. 9 is a block diagram of another temperature compensation oscillating device using the resonator of the present invention.

A resonator with plural electrodes according to the second embodiment of the present invention will now be described referring to FIG. 9. In this embodiment, two electrode pairs 11 and 12, on both sides, serve as compensation electrodes, while the remaining electrode pair 13 in the center serves as exciting electrodes. The electrodes 11a and 12a are electrically connected together by the path 14a while the electrodes 11b, 12b and 13b are also electrically connected together by the path 14b as per the first embodiment. The electrode pair 13 is connected to the oscillation circuit 2, and the electrode pairs 11 and 12 to the temperature compensation circuit 3. In short, this embodiment has the exciting electrode pair and the compensation electrode pairs in reverse arrangement to that of the first embodiment.

Since the connected electrodes 11a and 12a, and the connected electrodes 11b and 12b generate charges of different signs in the antisymmetric mode $f_{a1}$ of (y, 1, 2) in this embodiment as per the first embodiment, these charges cancel each other out. Therefore, the antisymmetric mode $f_{a1}$ of (y, 1, 2) has a smaller vibration level than the main mode of (y, 1, 1), thus making it possible to prevent the frequency jump phenomenon from the main vibration $f_0$ to the vibration $f_a$ in the antisymmetric mode.

Figure 10:
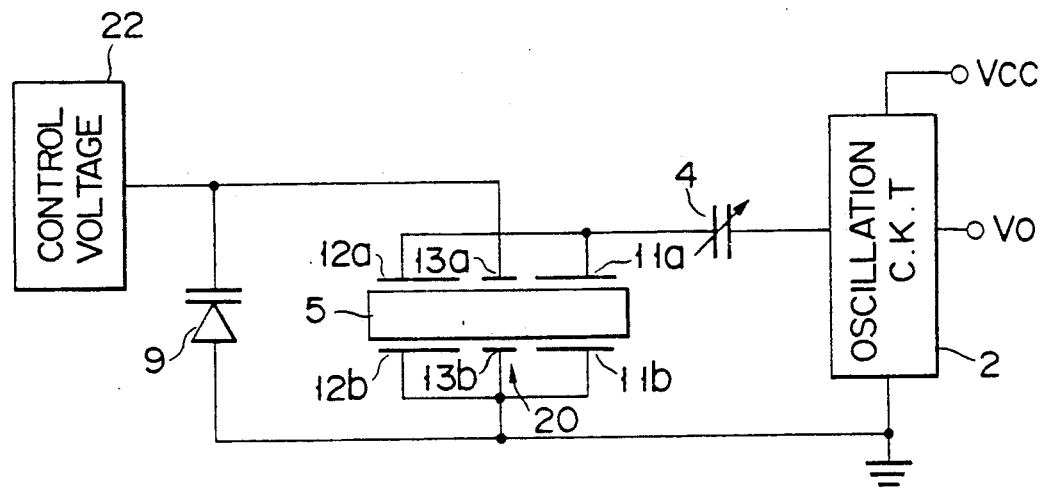
FIG. 10 is a block diagram illustrating a frequency variable oscillating device using the resonator of the present invention.

A resonator with plural electrodes according to the third embodiment of the present invention will now be described referring to FIG. 10. In this embodiment, the output voltage of a control voltage generator 22 is applied to the electrode 13a of the resonator 20, while the output of the control voltage generator 22 is applied via the voltage-variable capacitor 9 to the electrode 13b. The output voltage of the control voltage generator 22 differs from the temperature compensation voltage in the embodiment described above. Based on this output voltage, the variable capacitor 9 is controlled and the oscillation frequency of the resonator 20 is changed. Therefore, the resonator with plural electrodes according to the present invention can be used for other purposes than temperature compensation. When the resonator is used in another application, the same effect as obtained by the above embodiment can be produced.

Although the exciting and compensation electrode pairs are placed along the z' axis in the above embodiments, those electrode pairs may be arranged along the x axis, with the antisymmetric mode being (1, 2, 1) in this case.

Although, the divided electrodes are electrically connected by the paths formed on the surface of the crystal piece in these embodiments, the divided electrodes may be electrically connected together using lead lines provided outside the resonator. Electrode portions connecting with outer leads may be provided at any position of the crystal surface.

Figure 11:
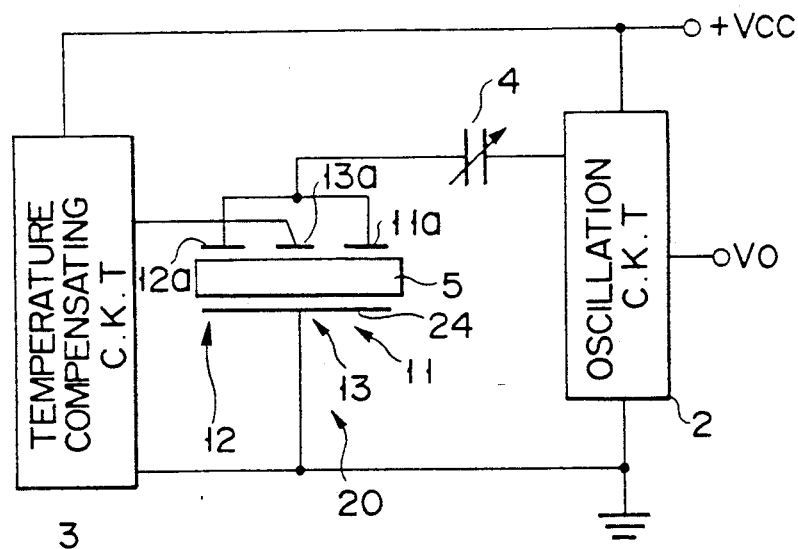
FIG. 11 is a block diagram illustrating a further temperature compensation oscillating device using the resonator of the present invention.

Although six electrodes constituting three pairs of electrodes in the resonator are isolated from one another, three on one main surface, and the other three on the other main surface, one common electrode 24 may be provided on one main surface as shown in FIG. 11, since the potentials of the electrodes on that main surface are equal to each other.

The voltage-variable capacitor 9 may be replaced with a variable capacitor or a variable inductor. In other words, the capacitor 9 can be replaced with any impedance as long as it is electrically coupled to the exciting electrode pair to change the frequency of the oscillation circuit.

The present invention can of course be applied to a double temperature-compensation crystal resonator which is disclosed in the aforementioned U.S. patent application Ser. No. 07/382,107 (now U.S. Pat. No. 5,004,988).

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A crystal resonator with plural electrodes, comprising:
    a crystal piece for causing thickness shear vibration;
    a first pair of electrodes provided in a center of said crystal piece and coupled to a variable impedance; and
    second and third pairs of electrodes provided on both sides of said first pair of electrodes, said second and third pairs of electrodes being electrically connected together, and coupled to an oscillation circuit.

2. A crystal resonator according to claim 1, wherein said crystal piece has first and second main surfaces;
    said first pair of electrodes includes a first electrode located on said first main surface and a second electrode located on said second main surface;
    said second pair of electrodes includes a third electrode located on said first main surface and a fourth electrode located on said second main surface;
    said third pair of electrodes includes a fifth electrode located on said first main surface and a sixth electrode located on said second main surface;
    said second, fourth and sixth electrodes being kept at electrically equal potential; and
    said third and fifth electrodes being electrically connected together by connection means for connecting said third and fifth electrodes.

3. A crystal resonator according to claim 2, wherein said second, fourth and sixth electrodes are formed integral on said second main surface.

4. A crystal resonator with plural electrodes, comprising:
    a crystal piece for causing thickness shear vibration;
    a first pair of electrodes provided in a center of said crystal piece and coupled to an oscillation circuit; and
    second and third pairs of electrodes provided on both sides of said first pair of electrodes, said second and third pairs of electrodes being electrically connected together, and coupled to a variable impedance.

5. A crystal resonator according to claim 4, wherein said crystal piece has first and second main surfaces;
    said first pair of electrodes includes a first electrode located on said first main surface and a second electrode located on said second main surface;
    said second pair of electrodes includes a third electrode located on said first main surface and a fourth electrode located on said second main surface;
    said third pair of electrodes includes a fifth electrode located on said first main surface and a sixth electrode located on said second main surface;
    said second, fourth and sixth electrodes being kept at electrically same potential; and
    said third and fifth electrodes being electrically connected together by connection means for connecting said third and fifth electrodes.

6. A crystal resonator according to claim 5, wherein said second, fourth and sixth electrodes are formed integral on said second main surface.

* * * * *